United States Patent [19]  [11] 4,349,402
Parker  [45] Sep. 14, 1982

[54] METHOD FOR PRODUCING A BRIGHT METALIZED FOIL OR BOARD
[75] Inventor: Harry A. Parker, Murray Hill, N.J.
[73] Assignee: Transfer Print Foils, Inc., East Brunswick, N.J.
[21] Appl. No.: 242,424
[22] Filed: Mar. 11, 1981

Related U.S. Application Data

[63] Continuation-in-part of Ser. No. 119,782, Feb. 8, 1980, abandoned.

[51] Int. Cl.³ .............................................. B44C 1/14
[52] U.S. Cl. ...................... 156/233; 156/90;
156/151; 156/231; 156/238; 156/239; 156/246;
156/247; 156/249; 156/278; 156/315; 156/324;
156/344; 229/3.5 MF; 229/87 C; 426/126;
427/147; 427/250; 427/404; 428/424.4;
428/425.8; 428/457; 428/914
[58] Field of Search ................. 156/90, 246, 151, 247,
156/192, 249, 231, 278, 233, 307.7, 238, 315,
239, 324, 241, 344; 427/147, 404, 250; 428/457,
914, 424.4, 425.8; 229/3.5 MF, 87 C; 426/126

[56] References Cited
U.S. PATENT DOCUMENTS

| 1,944,323 | 1/1934 | Kilchling | 91/68 |
| 2,703,772 | 3/1955 | Keithly | 156/239 |
| 3,043,728 | 7/1962 | Stauffer | 156/231 |
| 3,080,270 | 3/1963 | Lorenz | 156/239 |
| 3,235,395 | 2/1966 | Scharf | 117/3.3 |
| 3,308,004 | 3/1967 | Rouault | 161/1 |
| 3,463,659 | 8/1969 | Dragoon et al. | 117/71 |
| 3,589,962 | 6/1971 | Bonjour | 156/233 |
| 3,589,962 | 6/1971 | Bonjour | 156/247 |
| 3,620,872 | 11/1971 | Backwell | 156/231 |
| 3,730,752 | 5/1973 | Guajardo Garza et al. | 117/11 |
| 3,730,752 | 5/1973 | Garza et al. | 428/457 |
| 4,012,552 | 3/1977 | Watts | 156/233 |
| 4,153,494 | 5/1979 | Oliva | 156/230 |
| 4,250,209 | 2/1981 | de Leeuw et al. | 156/233 |

FOREIGN PATENT DOCUMENTS 7536682 8/1976 France ................................ 156/241

Primary Examiner—John J. Gallagher
Attorney, Agent, or Firm—David A. Jackson; Daniel H. Bobis

[57] ABSTRACT

The method for producing foil paper and foil board with a bright surface, by first metalizing a transfer-carrier, applying a compatible tacky dress to the metalized carrier, pressing the metalized carrier at its tacky surface against a base of paper or board; then separating the carrier from the metalized portion transferred to the base of paper or board, and curing it at an elevated temperature.

9 Claims, 2 Drawing Figures

METHOD FOR PRODUCING A BRIGHT METALIZED FOIL OR BOARD

CROSS REFERENCE TO RELATED APPLICATION

The present application is a continuation-in-part of copending application Ser. No. 119,782, filed Feb. 8, 1980, by the inventor herein, now abandoned.

BACKGROUND OF THE INVENTION

1. FIELD OF THE INVENTION

This invention relates generally to the production of foil paper and foil board, and particularly to such products having a brilliant metal surface.

2. PRIOR ART

Current packaging and labeling often relies on the use of foil paper and foil board upon which trademarks and other information is printed. The greater the brightness of the package or label, the greater the attention getting quality of the product. The brighter the foil paper or foil board used for packaging or labeling, the more attention it attracts to the product and the purchase possibilities become enhanced. Aluminum coated foil paper and foil board are extensively used because of brightness and attractiveness, and as well because color may be applied over the metalized dress to make a brilliant display. The metalized paper is also used to wrap cigarettes in packs, because such a wrapping is retentive to moisture, and prevents the cigarettes from drying out, as well as protecting them from insect infestation. Foil paper and foil board are produced by laminating strips or sheets of aluminum 0.00035' thick by the use of an adhesive to bond the metal foil to the paper strip or board. However, rolled aluminum used is not available with a very bright, shiny surface. Such a surface can be obtained by vacuum-metalizing the paper or board. But this has many problems. Paper is hygroscopic and releases moisture during the vacuum-metalizing, causing outgasing and the loss of vacuum. The irregular surface of the many papers causes greatly reduced reflectivity and marked dullness of the metal foil or board, presenting a matte rather than a mirror-like finish.

SUMMARY OF THE INVENTION

It has been found that an exceedingly bright metal surface on foil paper and foil board can be created by indirect aluminization; surprisingly, by first applying an aluminized dress to a carrier, and then transferring the metalized dress to and bonding it with paper or board base, by passing the first aluminized carrier with the final base product under pressure, by passing the two through the nip of a pair of rollers. Then it is cured. The transferred aluminum dress will be exceedingly brilliant.

THE DRAWINGS

These objects and advantages as well as other objects and advantages may be attained by the procedure shown by way of illustration in the drawings in which.

PREFERRED EMBODIMENT

Figure 1:
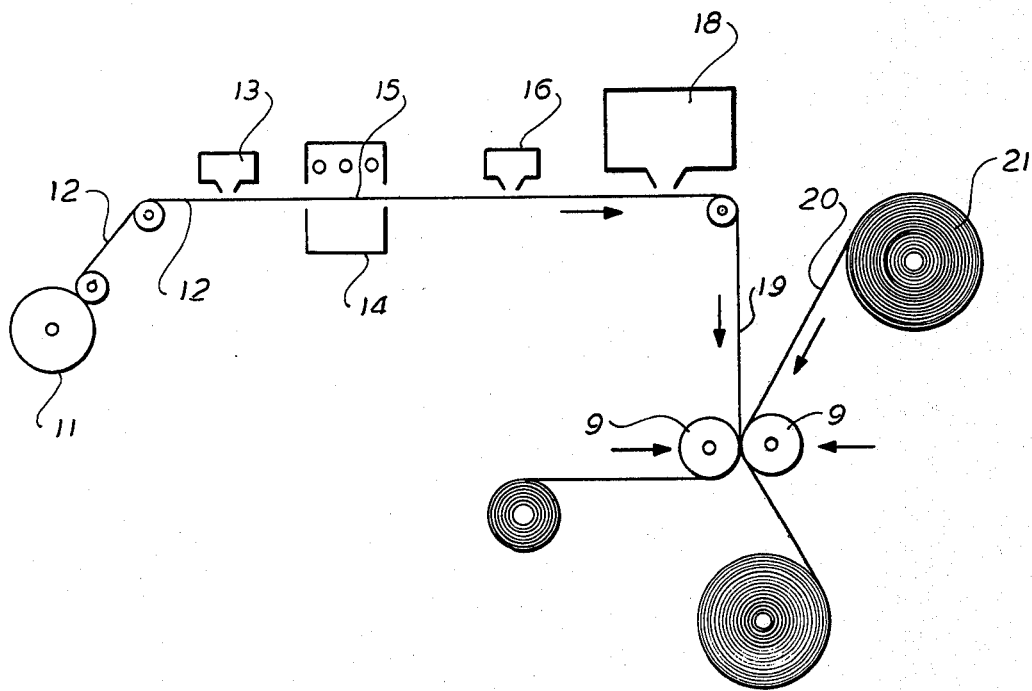
FIG. 1 is a plan view or flow chart showing the apparatus for producing bright metalized foil paper or board by transferring the aluminum dress for a carrier to a base.
Figure 2:
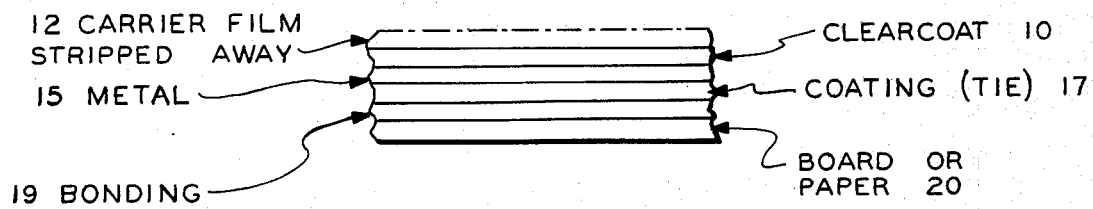
FIG. 2 is a vertical cross-sectional view of the bright foil paper or board with a carrier strip separated from the base.

Referring now to the drawings in detail, the production of bright metal foil paper or foil board proceeds in the following manner. A supply roll 11 delivers a polyester sheet, strip or carrier 12 to a series of coaters. The carrier 12 is preferably one mil. thick, although its thickness is not critical, but it need only be sufficiently thick to withstand the stress of the process. Although polyester has been referred to, other carrier material may be used, provided that it will not deteriorate during metalizing or under tension of delaminating or releasing the product.

A clear lacquer 10 coating is applied by the coater 13. The carrier 12 is then passed through the vacuum furnace 14 where vaporized aluminum 15 condenses on its upper surface. The carrier 12 then passes a second coater 16 where a tie coat 17 is applied. This tie coat 17 serves to strengthen bright metal aluminized coat 15. The carrier 12 then passes to the coater 18 where an emulsion coat 19 is applied. The emulsion coat 19 is a bonding agent. The film 12 is then led into the nip of the opposed rollers 9, 9 with a sheet or strip of paper or board 20 from the supply roller 21. After leaving the nip of the pressure rollers 9, 9 the carrier 12 is separated from the clear coat 10, with the vacuum-metalized dress 15 and the tie coat 17, adhesive coat 19, and base 20 thereon. The metal foil will be very bright. The paper or foil board is then dried in an oven at approximately 250° F. for one minute and is then ready to use.

Although I have referred to aluminum metalizing, other metals, both base and precious, may be used. Also, pearl coatings and paint coatings such as "day-glo" may be applied with enhanced brilliance.

Labels imprinted with colored inks over metalized foil or board will have great dazzle and brilliance.

MATERIALS FOUND SUITABLE

1. Carrier 12—polyester strip one mil. thick or similar material.
2. Lacquer Coat 10—nitro-cellulose or vinyl acetate-vinyl chloride copolymer resins or equivalents. The coating thickness should be in the neighborhood of 0.0.0005 to 0.005 thousandths of an inch.

EXAMPLE I

| | Parts by Weight |
|---|---|
| ½ Second Viscosity Nitrocellulose (70% wet in Alcohol Hercules Powder Company) | 20 |
| METHYL ETHYL KETONE SOLVENT | 50 |
| DENATURED ETHYL ALCOHOL | 30 |
| | 100 |

EXAMPLE II

| | Parts by Weight |
|---|---|
| Vinyl Acetate Vinyl Chloride Copolymer such as Union Carbide Corp. VAGH | 15 |
| METHYL ETHYL KETONE | 50 |
| TOLUOL | 35 |
| | 100 |

3. Tie Coat 17—Polyurethane coatings such as Mobay Chemicals Desmocoll E471 or E477 or equivalent. Coating thickness should be in the neighborhood of 0.0005 thousandths of an inch to 0.0008 thousandths of an inch. Tie coat should be a flexible polyurethane coating. While polyurethanes formed from the combination of Toluene diisocyanate with polyol are acceptable, the aliphatic isocyanates are desirable for their non-yellowing characteristics.

EXAMPLE I (Aromatic Type)

(Some Yellowing)

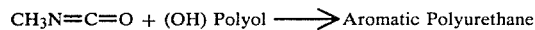
CH$_3$N=C=O + (OH) Polyol ⟶ Aromatic Polyurethane

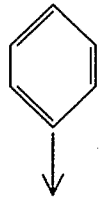

2,4 isomer of Toluene diisocyanate

EXAMPLE II (Aliphatic Type)

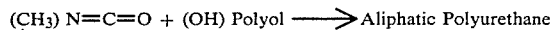
(CH$_3$) N=C=O + (OH) Polyol ⟶ Aliphatic Polyurethane

Aliphatic isocyanate

The reactions forming the urethane are as follows:

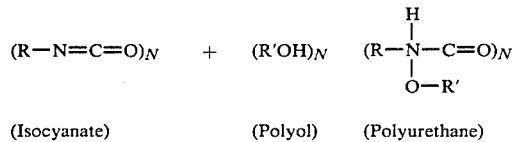

(Isocyanate)    (Polyol)    (Polyurethane)

R' & R can be an aromatic or aliphatic carbon hydrogen chain.

4. Emulsion Coat 19—emulsion or vinyl acetate homopolymer or vinyl acetate-copolymer with pH values of 4.5–5.5 and particle sizes from 2–7 microns. Coating weights should be from 0.0005 to 0.001 thousandths of an inch. The coating 19 must be a coating capable of wetting the paper or board. The penetration into the paper fiber is mandatory. The use of Vinyl Acetate has shown the best properties for penetration. Shellac emulsions also show good penetration properties. Also an acrylic emulsion such as Rohm & Haas AC 61 is also a good wetting emulsion. Polyvinyl alcohol is another emulsion with good fiber wetting properties.

EXAMPLE I

| | |
|---|---|
| Vinyl Alcohol Emulsion (Franklin Chemical Industries FH 2) | 50 parts |
| Water | 50 parts |

Coat to a weight of 3.5 pounds per 1 500 square feet.

EXAMPLE II

| | |
|---|---|
| Union Chemical Amsco Res. 3 or 4 non ionic polyvinyl acetate Homopolymer | 50 parts |
| Water | 50 parts |

When the carrier 12 and the paper or board 20 enter the nip of the rollers 9, 9, the emulsion coat 19 applied by the coater 18 is still in a wet state; consequently, this is a wet process; "wet process" refers to the condition of the adhesive emulsion on the carrier as it enters the nip of the rollers.

What is claimed is:

1. A method for preparing a metalized paper or board product having improved surface brightness consisting essentially of:
   A. feeding a carrier film;
   B. applying a lacquer coating to said carrier film capable of adherently bonding to a deposited metal layer and receiving display material;
   C. vapor depositing a metal layer on said lacquer coating;
   D. applying a polyurethane tie coating to said metal layer;
   E. applying a wet adhesive emulsion coating having an acidic pH to the tie coating;
   F. feeding the carrier of Step E and a base selected from paper and board, into the nip of a pair of pressure rollers, so that said adhesive emulsion coating remains wet as it contacts said base, and penetrates said base after said base and said carrier are brought together between said pressure rollers; and
   G. separating said carrier from said base.

2. The method of claim 1 wherein the coated base of Step G is thereafter heated to dry said adhesive coating.

3. The method of claim 2 wherein said coated base is heated at a temperature of about 250° F., for about one minute.

4. The method of claim 1 wherein said lacquer coating is colored.

5. The method of claim 1 wherein said tie coating has an affinity for said adhesive coating.

6. The method of claim 1 wherein said tie coating comprises a polyurethane coating prepared with an aliphatic isocyanate.

7. The method of claim 1 wherein said adhesive coating comprises a material selected from vinyl acetate homopolymers, vinyl acetate copolymers, shellac emulsions, polyvinyl alcohol emulsions and acrylic emulsions.

8. The method of claim 1 wherein said pH ranges from about 4.5 to about 5.5.

9. A method for producing a foil metalized paper or board product with a bright, shiny surface, consisting of:
   A. feeding a carrier film;
   B. applying a protective coat comprising a clear lacquer, to said carrier film, said carrier coat capable of bonding to aluminum and receptive to display material;
   C. vapor depositing a metal coat on said protective coat;
   D. applying a polyurethane tie coat to the metal coat;
   E. applying a wet emulsion coat to the polyurethane tie coat, the wet emulsion coat prepared from a material selected from the group consisting of vinylacetate homopolymers, vinylacetate copolymers, shellac emulsions, polyvinyl alcohol emulsions and acrylic emulsions;

F. feeding a base selected from the group consisting of paper and board, and said carrier with said emulsion coat, into the nip of a pair of pressure rollers so that emulsion coat remains wet as it contacts said base, and said emulsion coat penetrates said base after said base and said carrier are brought together between said pressure rollers; and G. separating said carrier from said base, whereby said wet emulsion coat, said tie coat, said metal coat and said protective coat are transferred from said carrier to said base.

* * * * *